(12) United States Patent
Shim et al.

(10) Patent No.: US 9,575,217 B2
(45) Date of Patent: Feb. 21, 2017

(54) OPTICAL FILM FOR REDUCING COLOR SHIFT AND ORGANIC LIGHT-EMITTING DISPLAY DEVICE EMPLOYING THE SAME

(71) Applicant: Samsung Electronics Co., Ltd., Suwon-si, Gyeonggi-do (KR)

(72) Inventors: Hong-shik Shim, Seoul (KR); Eun-young Cho, Chungcheongnam-do (KR); Hyun-min Kim, Uiwang-si (KR); You-min Shin, Chungcheongnam-do (KR); Young Oh, Uiwang-si (KR); Chul-ho Jeong, Gwangju-si (KR)

(73) Assignees: Samsung Electronics Co., Ltd., Gyeonggi-do (KR); Cheil Industries, Inc., Gyeongsangbuk-do (KR)

(*) Notice: Subject to any disclaimer, the term of this patent is extended or adjusted under 35 U.S.C. 154(b) by 0 days.

(21) Appl. No.: 14/803,795

(22) Filed: Jul. 20, 2015

(65) Prior Publication Data

US 2015/0323707 A1    Nov. 12, 2015

Related U.S. Application Data

(63) Continuation of application No. 14/158,287, filed on Jan. 17, 2014, now Pat. No. 9,341,750.

(30) Foreign Application Priority Data

Jun. 4, 2013  (KR) .......................... 10-2013-0064338

(51) Int. Cl.
*H01L 51/00*     (2006.01)
*G02B 1/111*     (2015.01)
(Continued)

(52) U.S. Cl.
CPC ................. *G02B 1/111* (2013.01); *G02B 1/10* (2013.01); *G02B 1/11* (2013.01); *G02B 3/0037* (2013.01);
(Continued)

(58) Field of Classification Search
CPC ........................ H01L 51/5268; H01L 51/5275
(Continued)

(56) References Cited

U.S. PATENT DOCUMENTS 5,521,726 A * 5/1996 Zimmerman ........ G02B 5/3025
                                                    349/159
8,995,807 B1 * 3/2015 Jalava ...................... G02B 6/34
                                                    385/37
(Continued)

FOREIGN PATENT DOCUMENTS

KR    10-1200770 B1    11/2012

OTHER PUBLICATIONS

Office Action dated Aug. 28, 2015 issued in related U.S. Appl. No. 14/158,287.
(Continued)

*Primary Examiner* — David Vu
*Assistant Examiner* — Brandon Fox
(74) *Attorney, Agent, or Firm* — Harness, Dickey & Pierce, P.L.C.

(57) ABSTRACT

Optical films, and organic light-emitting display devices employing the same, include a high refractive index pattern layer including a lens pattern region and a non-pattern region alternately formed, wherein the lens pattern region includes a plurality of grooves each having a depth larger than a width thereof, and the non-pattern region has no pattern; and a low refractive index pattern layer formed of a material having a refractive index smaller than a refractive index of the high refractive index pattern layer, wherein the
(Continued)

low refractive index pattern includes a plurality of filling portions filling the plurality of grooves.

21 Claims, 14 Drawing Sheets

(51) Int. Cl.
| | |
|---|---|
| *G02B 1/11* | (2015.01) |
| *H01L 51/52* | (2006.01) |
| *G02B 5/02* | (2006.01) |
| *G02B 1/10* | (2015.01) |
| *G02B 5/30* | (2006.01) |
| *G02B 3/00* | (2006.01) |
| *G02B 5/20* | (2006.01) |
| *H01L 27/32* | (2006.01) |

(52) U.S. Cl.
CPC ............ *G02B 5/0215* (2013.01); *G02B 5/201* (2013.01); *G02B 5/305* (2013.01); *H01L 51/5246* (2013.01); *H01L 51/5265* (2013.01); *H01L 51/5268* (2013.01); *H01L 51/5271* (2013.01); *H01L 51/5275* (2013.01); *H01L 51/5281* (2013.01); *H01L 51/5293* (2013.01); *H01L 27/322* (2013.01); *H01L 27/3211* (2013.01)

(58) Field of Classification Search
USPC .............................. 257/40; 349/96; 359/456
See application file for complete search history.

(56) References Cited

U.S. PATENT DOCUMENTS

| | | | |
|---|---|---|---|
| 2002/0167725 A1 | 11/2002 | Goto | |
| 2010/0245736 A1* | 9/2010 | Nishihara | G02B 5/0236 349/112 |
| 2012/0154719 A1* | 6/2012 | Umeda | G02B 1/105 349/96 |
| 2012/0286258 A1 | 11/2012 | Naraoka et al. | |

OTHER PUBLICATIONS

Notice of Allowance dated Jan. 8, 2016 issued in related U.S. Appl. No. 14/158,287.

* cited by examiner

OPTICAL FILM FOR REDUCING COLOR SHIFT AND ORGANIC LIGHT-EMITTING DISPLAY DEVICE EMPLOYING THE SAME

CROSS-REFERENCE TO RELATED APPLICATIONS

This application is a continuation of U.S. application Ser. No. 14/158,287, filed on Jan. 17, 2014, which claims priority to Korean Application No. 10-2013-0064338 filed on Jun. 4, 2013, the entire contents of each of which are hereby incorporated by reference.

BACKGROUND

1. Field

The present disclosure relates to optical films for reducing color shift and/or organic light-emitting display devices employing the same.

2. Description of the Related Art

Organic light-emitting diodes (OLEDs) include an anode, an organic light-emitting layer, and a cathode. Here, when a voltage is applied between the anode and the cathode, holes are injected into the organic light-emitting layer from the anode, and electrons are injected into the organic light-emitting layer from the cathode. At this time, the holes and the electrons, which are injected into the organic light-emitting layer, are recombined in the organic light-emitting layer so as to generate excitons, and the excitons emit light while transitioning from an excited state to a ground state.

In such an OLED, a lifespan problem resulting from deterioration due to a luminescent material, which is an organic material, is key in developing OLED technology, and many techniques have been introduce to overcome this problem.

A technique using a microcavity structure, which is one of the techniques to overcome the lifespan problem, causes light that is being emitted and has a specific wavelength to resonate, so as to increase the intensity of the light and emit the light to the outside. That is, in the technique, a distance between an anode and a cathode is designed to match with a representative wavelength of each of red (R), green (G), and blue (B), so that only a corresponding light beam resonates and is emitted to the outside and other light beams are attenuated. As a result, in the technique, the intensity of the light beam emitted to the outside is increased and sharpened, thereby increasing brightness and color purity. In addition, the increase in brightness induces low power consumption, thereby increasing a lifespan of the OLED.

However, in a microcavity structure, wavelengths to be amplified are determined based on a thickness of an organic deposition material layer. Here, a length of a light path changes at lateral sides, thereby causing an effect similar to a change in the thickness of an organic deposition material layer. Therefore, wavelengths to be amplified are changed.

In other words, as the viewing angle is tilted from the front to a side, the maximum resolution wavelength becomes shorter, and thus a color shift occurs as the maximum resolution wavelength decreases. For example, even if white color is embodied at the front, the white color may become bluish at a lateral side due to blue shift phenomenon.

SUMMARY

Provided are optical films for reducing color shift and/or organic light-emitting display devices employing the same.

According to some example embodiments, an optical film includes a high refractive index pattern layer including a lens pattern region and a non-pattern region alternately formed, wherein the lens pattern region includes a plurality of grooves each having a depth larger than a width thereof, and the non-pattern region has no pattern; and a low refractive index pattern layer formed of a material having a refractive index smaller than a refractive index of the high refractive index pattern layer, wherein the low refractive index pattern includes a plurality of filling portions filling the plurality of grooves.

The plurality of grooves may be engraved in the lens pattern region.

The lens pattern region may have a width larger than a width of the non-pattern region.

The low refractive index pattern layer may further include a flat film having a set thickness, and the flat film connects the plurality of filling portions.

The low refractive index pattern layer may be formed of a resin material.

The low refractive index pattern layer may be formed of a transparent resin material containing a light diffuser or a light absorber.

The plurality of grooves may each have an extended stripe shape.

The plurality of grooves may have a dot shape in a perspective view with respect to the high refractive index pattern layer, and a parabolic shape in a cross-sectional view shape with respect to the high refractive index pattern layer.

The optical film may be attached to a display panel having an arrangement of pixels, the arrangement of pixels including an emission region and a non-emission region alternately formed, wherein the lens pattern region faces the emission region, and wherein the lens pattern region and the non-pattern region are arranged so that the non-pattern region faces at least a part of the non-emission region.

The lens pattern region may have a width larger than a width of the emission region.

The optical film may further include an anti-reflection film on the high refractive index pattern layer; and a first adhesive layer under the low refractive index pattern layer.

A first base layer may be between the high refractive index pattern layer and the anti-reflection film.

The optical film may further include a circular polarization film including a phase shift layer and a linear polarization layer.

The first adhesive layer, the low refractive index pattern layer, the high refractive index pattern layer, the phase shift layer, the linear polarization layer, the first base layer and the anti-reflection film may be sequentially arranged.

The optical film may further include a second base layer and a second adhesive layer, wherein the high refractive index pattern layer, the second base layer, the second adhesive layer and the phase shift layer are sequentially arranged.

The first adhesive layer, the phase shift layer, the linear polarization layer, the low refractive index pattern layer, the high refractive index pattern layer, the first base layer and the anti-reflection film may be sequentially arranged.

The optical film may further include a second base layer and a second adhesive layer, wherein the linear polarization layer, the second base layer, the second adhesive layer and the low refractive index pattern layer are sequentially arranged.

The first adhesive layer, the phase shift layer, the low refractive index pattern layer, the high refractive index pattern layer, the linear polarization layer, the first base layer and the anti-reflection film may be sequentially arranged.

The optical film may further include a second base layer between the high refractive index pattern layer and the linear polarization layer.

The optical film may further include a phase shift layer, a linear polarization layer, and a first base layer, wherein the first adhesive layer, the phase shift layer, the linear polarization layer, the first base layer and the low refractive index pattern layer are sequentially arranged.

The optical film may further include a transmittance adjusting layer between the high refractive index pattern layer and the anti-reflection film.

The optical film may further include a first carrier film between the high refractive index pattern layer and the transmittance adjusting layer.

The optical film may further include a second adhesive layer between the first carrier film and the transmittance adjusting layer, and a second carrier film between the transmittance adjusting layer and the anti-reflection film.

The optical film may further include a first carrier film between the transmittance adjusting layer and the anti-reflection film.

The optical film may further include a second adhesive layer between the high refractive index pattern layer and the transmittance adjusting layer, and a second carrier film between the first adhesive layer and the low refractive index pattern layer.

According to other example embodiments, an organic light-emitting display device includes an organic light-emitting display panel including a plurality of pixels and an organic light-emitting layer, wherein the plurality of pixels each emit light beams having different wavelengths, and the organic light-emitting layer has a microcavity structure configured to resonate and emit a light beam of a corresponding wavelength; and the optical film on the organic light-emitting display panel.

The plurality of grooves may each have an extended stripe shape.

The optical film may be arranged on the organic light-emitting display panel in such a manner that a longitudinal direction of the extended stripe shape is in a vertical direction of the organic light-emitting display panel.

A width of the non-pattern region of the optical film in a horizontal direction may be smaller than a distance between the plurality of pixels separated from each other in the horizontal direction.

A ratio of an area of the lens pattern region in the optical film may be greater than an aperture ratio of the organic light-emitting display panel.

The organic light-emitting display device may further include a first adhesive layer between the organic light-emitting display panel and the low refractive index pattern layer; and an anti-reflection film on the high refractive index pattern layer.

A circular polarization film including a phase shift layer and a linear polarization layer may be between the high refractive index pattern layer and the anti-reflection film.

The organic light-emitting display device may further include a transmittance adjusting layer between the high refractive index pattern layer and the anti-reflection film.

BRIEF DESCRIPTION OF THE DRAWINGS

Example embodiments will be more clearly understood from the following detailed description taken in conjunction with the accompanying drawings.

FIG. 1 is a cross-sectional view illustrating a schematic structure of an optical film according to some example embodiments of the present disclosure;

FIG. 2 is an exploded perspective view illustrating a detailed shape of a lens pattern region in the optical film of FIG. 1;

FIG. 3 illustrates a light path through which light is perpendicularly incident on the lens pattern region of the optical film of FIG. 1;

FIG. 4 illustrates a light path through which light is obliquely incident on the lens pattern region of the optical film of FIG. 1;

FIG. 5 is a conceptual diagram in which image blur may occur in a display panel including an optical film according to a comparative example;

FIG. 6 is an exploded perspective view illustrating a schematic structure of an optical film according to other example embodiments of the present disclosure;

FIG. 7 is an exploded perspective view illustrating a schematic structure of an optical film according to still other example embodiments of the present disclosure;

FIG. 8 is a perspective view illustrating a schematic structure of an optical film according to further example embodiments of the present disclosure;

FIG. 9 is a cross-sectional view illustrating a schematic structure of an optical film according to yet other example embodiments of the present disclosure;

FIGS. 10 to 16 are examples employing a circular polarization film and are cross-sectional views illustrating schematic structures of optical films according to various example embodiments of the present disclosure;

FIGS. 17 to 20 are examples employing a transmittance adjusting layer and are cross-sectional views illustrating schematic structures of optical films according to various example embodiments of the present disclosure;

FIG. 21 is a cross-sectional view illustrating a schematic structure of an organic light-emitting display device according to example embodiments of the present disclosure;

FIG. 22 is a schematic diagram illustrating an arrangement relationship between an optical film and pixels in the organic light-emitting display device of FIG. 21; and FIG. 23 is a simulation graph illustrating image blur (blur intensity) and color shift $\Delta u'v'$ according to S2/S1.

DETAILED DESCRIPTION

Figure 1:
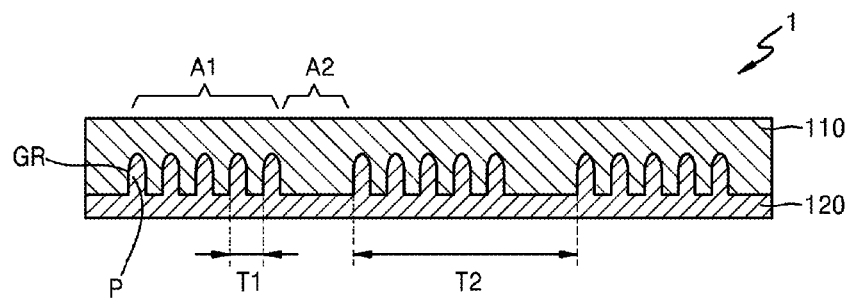
FIGS. 1-23 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Figure 2:
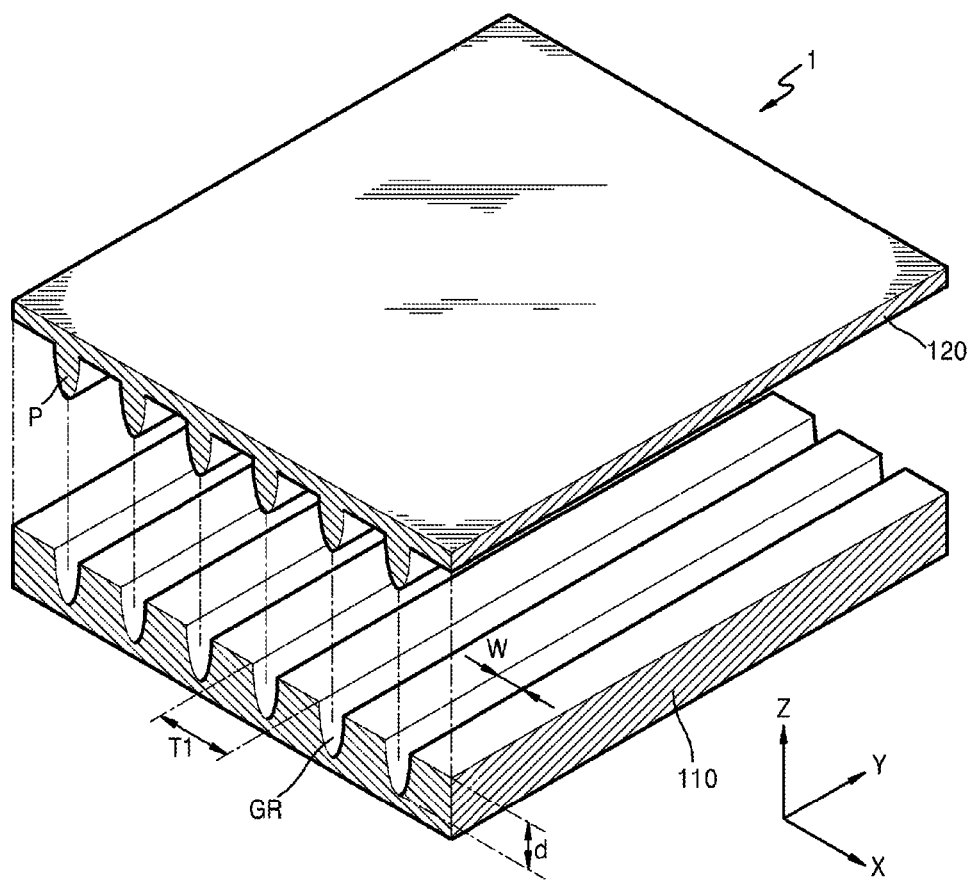

FIG. 1 is a cross-sectional view illustrating a schematic structure of an optical film according to some example embodiments of the present disclosure. FIG. 2 is an exploded perspective view illustrating a detailed shape of a lens pattern region in the optical film 1 of FIG. 1.

Referring to FIGS. 1 and 2, an optical film 1 includes a high refractive index pattern layer 110 and a low refractive index pattern layer 120. In the high refractive index pattern layer 110, the lens pattern region A1 in which a plurality of grooves GR, which each has a depth that is larger than a width thereof, are formed (or, engraved) and a non-pattern region A2 having no pattern are alternately formed. The low refractive index pattern layer 120 is formed of a material having a refractive index that is smaller than that of the high refractive index pattern layer 110, and includes a plurality of filling portions P that fill the plurality of grooves GR.

The grooves GR may be formed using techniques known in the art. For example, a high refractive index layer (not shown) may be etched using photolithography techniques, wet or dry chemical mechanical polishing or similar techniques.

The high refractive index pattern layer 110 is formed of a material having a refractive index that is greater than 1 (e.g., a transparent plastic material). In addition, the high refractive index pattern layer 110 may be formed of a transparent plastic material including a light diffuser or a light absorber. Diffusion beads may be used as the light diffuser, and a black dye, such as carbon black, may be used as the light absorber. The light diffuser improves a psycho-visual characteristic by planarizing peaks that may occur in a color shift graph or a luminance profile according to viewing angles. In addition, the light absorber may contribute to improving characteristics, such as a contrast ratio or color purity, by using a dye that selectively absorbs a specific wavelength or carbon black that may absorb all wavelengths of a visible ray.

The groove GR may be formed to have an aspect ratio that is greater than 1 (i.e., the groove GR may be formed to have a depth d that is greater than a width w), and may be repeatedly disposed with a set (or, predetermined) period T1.

A surface of the groove GR may be a curved surface or an aspherical surface. For example, the curved surface of the groove GR may be an ellipsoid, a paraboloid, or a hyperboloid. In addition, the groove GR may have an extended stripe shape (or, extend along the z-axis) as illustrated in FIG. 2.

As illustrated in FIG. 2, the low refractive index pattern layer 120 may be formed as a flat film having a set (or, predetermined) thickness which connects filling portions that fill the grooves GR. The thickness and flatness of a flat_portion may vary according to a filling material to be filled into the grooves GR or a filling method. In addition, the low refractive index pattern layer 120 is formed of a material having a refractive index that is smaller than that of the high refractive index pattern layer 110. The low refractive index pattern layer 120 may be formed of a transparent plastic material, or a transparent plastic material including a light diffuser or a light absorber. Diffusion beads may be used as the light diffuser, and a black dye, such as carbon black, may be used as the light absorber.

The lens pattern region A1 and the non-pattern region A2 may be alternately disposed within a set (or, predetermined) period T2. The set (or, predetermined) period T2, the width of the lens pattern region A1, and the width of the non-pattern region A2 may be determined in consideration of the arrangement of pixels of a display panel to which the optical film 1 is attached. The optical film 1 may be attached to the display panel having the arrangement of pixels in which an emission region and a non-emission region are alternately disposed. The widths of the lens pattern region A1 and the non-pattern region A2 and the set (or predetermined) period T2 may be determined so that the lens pattern region is disposed to face the emission region and that the non-pattern region is disposed to face at least a part of the non-emission region. An arrangement relationship between the optical film 1 and the display panel will be described below with reference to FIGS. 21 and 22.

The lens pattern region A1 of the optical film 1 refracts light, which is incident from one direction, in various directions according to its incidence position, and emits and mixes the light. On the other hand, the non-pattern region A2 is a region where such a function of the lens pattern region A1 is not performed. The non-pattern region A2 is appropriately disposed between the lens pattern regions A1, thereby allowing image blur to be reduced.

First, the function of the lens pattern region A1 will be described below with reference to FIGS. 3 and 4.

Figure 3:
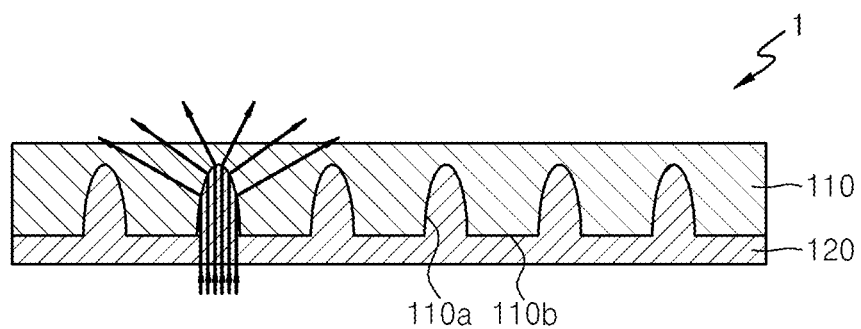

FIG. 3 illustrates a light path through which light is perpendicularly incident on the lens pattern region of the optical film of FIG. 1. FIG. 4 illustrates a light path through which light is obliquely incident on the lens pattern region of the optical film of FIG. 1. For convenience of description, the optical film is shown to include only the lens pattern region.

Figure 4:
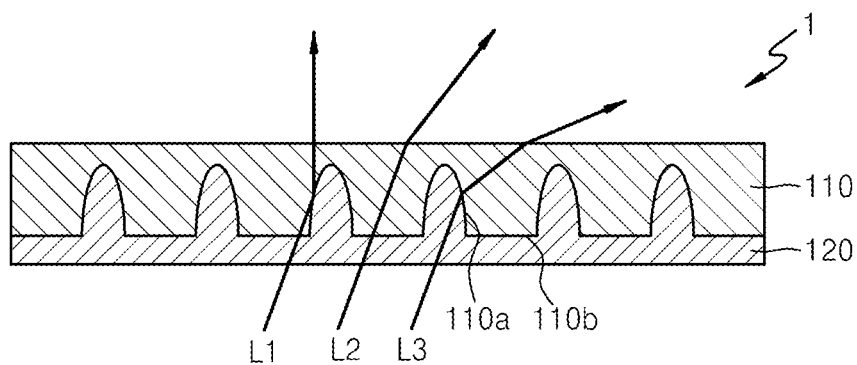

Referring to FIGS. 3 and 4, an interface between the high refractive index pattern layer 110 and the low refractive index pattern layer 120 includes curved surfaces 110a and flat surfaces 110b which constitute the grooves GR. The curved surface 110a serves as a lens surface.

Referring to FIG. 3, the light that is perpendicularly incident on the optical film 1 is refracted in different directions according to positions at which the light encounters the curved surface 110a, and is emitted from the optical film 1. That is, because light beams having the same incidence angle are refracted in various directions according to positions at which the light beams encounter the curved surface 110a, there is an effect of light diffusion.

In addition, referring to FIG. 4, the light that is obliquely incident on the optical film 1 is refracted in different directions according to positions on which the light is incident. Specifically, a light beam L1, which encounters the curved surface 110a in the high refractive index pattern layer 110 via the flat surface 110b, is totally reflected from the curved surface 110a, and is emitted from the optical film 1. In this path, an angle at which the light is emitted from the top surface of the high refractive index pattern layer 110 is smaller than that at which the light is incident on the optical film 1. On the other hand, a light beam L2 passing through the flat surface 110b without passing through the curved surface 110a is refracted in such a manner that a refraction angle of the light beam L2 is greater than an incidence angle thereof at an interface between the high refractive index pattern layer 110 and the outside, and thus the light beam L2 is emitted from the optical film 1 with an angle greater than an angle at which the light beam L2 is incident on the optical film 1. In addition, light that encounters the curved surface 110a in the low refractive index pattern layer 120 is refracted on the curved surface 110a and is then refracted again on the top surface of the high refractive index pattern layer 110, and thus the light is emitted from the optical film 1 at a refraction angle greater than that of the light beam L2 that is emitted via the flat surface 110b without encountering the curved surface 110a. In this manner, the light beams L1, L2, and L3 that are obliquely incident on the optical film 1 at the same angle are emitted from the optical film 1 at different refraction angles according to positions on which the light beams L1, L2, and L3 are incident.

As described above, the light passing through the optical film 1 is a combination of light beams that are incident on the optical film 1 at various angles.

In the above description, the detailed light path through which incidence light is diffused is just an example. The light path slightly varies according to the difference in the refractive index between the high refractive index pattern layer 110 and the low refractive index pattern layer 120, the aspect ratio of the groove GR in the high refractive index pattern layer 110, the period T1 with which the grooves GR are repeatedly disposed, the width w of the grooves GR, the shape of the curved surface of the groove GR, or the like, and thus the degree to which light beams are combined or the brightness of the emitted light varies.

The above-described light mixing effect allows, when light incident on the optical film 1 has different optical characteristics according to incidence angles thereof, the light to equally mix the optical characteristics and to be emitted. For example, when light is emitted from an organic light-emitting diode (OLED), a color shift phenomenon is shown in which the light has different color characteristics according to emission angles thereof. Because the degrees of color shift are mixed after the light passes through the optical film 1 having the above-described structure, the degree of color shift according to viewing angles is reduced.

As described above, the lens pattern region of optical film 1 has a good function for reducing color shift, but which results in image blur.

Figure 5:
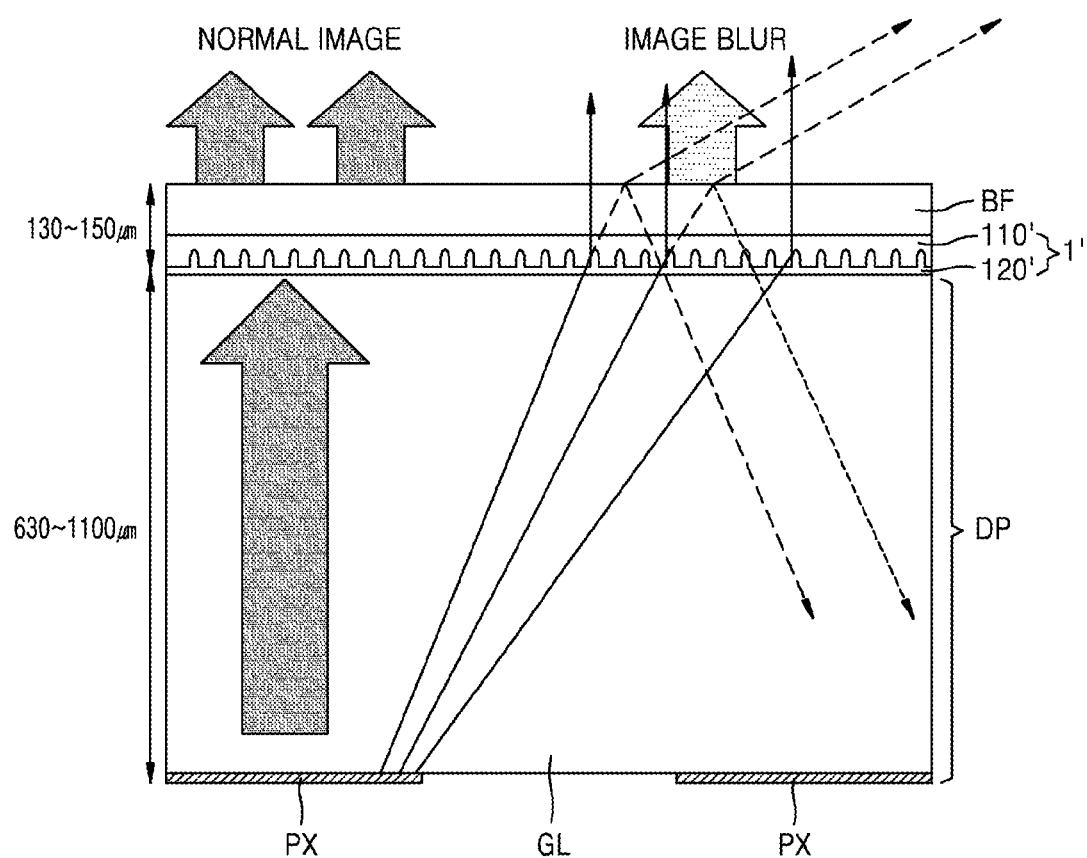

FIG. 5 is a conceptual diagram in which image blur may occur in a display panel including an optical film according to a comparative example.

Unlike the structure of FIG. 1 in which the lens pattern region and the non-pattern region are alternately disposed, an optical film 1' according to the comparative example is configured as the lens pattern region as a whole.

That is, the optical film 1' includes a high refractive index pattern layer 110' in which a plurality of grooves are formed, and a low refractive index pattern layer 120' including filling portions that fill the grooves. The plurality of grooves are uniformly formed in the high refractive index pattern layer 110'.

The optical film 1' is any of various types of films including a base material or an anti-reflection film. The optical film 1' and a base film BF are attached onto a display panel DP.

The display panel DP includes a plurality of pixels PX that are formed so as to be separated from each other at set (or predetermined) intervals. The pixel PX is an emission region, and a region between the pixels PX is a non-emission region. A ratio of the emission region in the display panel DP is referred to as an aperture ratio. Because there is a limitation in reducing an area of a wiring line or a TFT, the aperture ratio is decreased as the pixel PX is reduced in size, that is, as a resolution becomes high.

In this manner, when the area of the non-emission region is large, the optical film 1' that is disposed to correspond to the non-emission region causes image blur and a ghost image, which results in a reduction in image quality.

In FIG. 5, a solid line represents a light path in a case that the optical film 1' is present, and a dotted line represents a case where it is assumed that the optical film 1' is not present. When the optical film 1' is not present, light that is incident on a position corresponding to an upper portion of the non-emission region or an upper portion of the adjacent pixel from the pixels PX is refracted and reflected on a top surface of the base film BF and is then directed to a position that is out of a viewer's sight. However, when the optical film 1' is present, light reaches the viewer's eyes by passing through the base film BF along the same light path as the solid line by the action of a lens pattern, and the light causes image blur.

The image blur may be reduced by reducing a distance between the pixel PX and the optical film 1', but there is a limitation in reducing the distance because a glass substrate GL that is generally used as a substrate of the display panel DP has a thickness of about 630 to about 1100 μm.

In the optical film of the current example embodiments, the non-pattern region is introduced to the position corresponding to the non-emission region between the pixels so as to reduce image blur.

Figure 6:
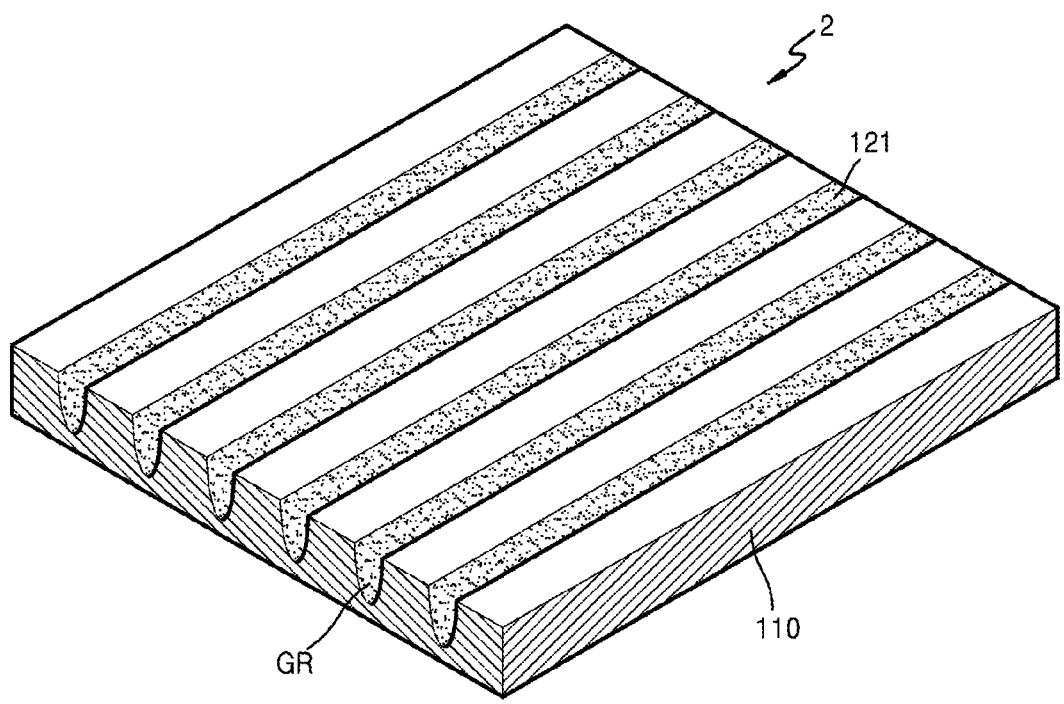

FIG. 6 is a perspective view illustrating a schematic structure of an optical film according to other example embodiments of the present disclosure.

Similarly to the optical film 1 of FIG. 1, an optical film 2 includes a lens pattern region and a non-pattern region. For convenience of description, the optical film 2 is shown to include only the lens pattern region.

The optical film 2 includes the high refractive index pattern layer 110 in which the plurality of grooves GR each constituted by a curved surface are formed or engraved, and a low refractive index pattern layer 121. The groove GR is formed to have a depth that is greater than a width thereof. The high refractive index pattern layer 110 is formed of a material having a refractive index that is greater than 1. The low refractive index pattern layer 121 is formed of a material having a refractive index that is lower than the refractive index of the high refractive index pattern layer 110. The optical film 2 of the current example embodiments is different from the optical film 1 of the previous example embodiments in terms of the shape of the low refractive index pattern layer 121. That is, as compared with the optical film 1 of FIG. 1, the low refractive index pattern layer 121 does not have a shape including a flat film connecting filling portions that fill the grooves GR, and is constituted by only the filing portions filled in the grooves GR. The filling portions that fill the grooves GR may be formed of a resin material or may be air.

Figure 7:
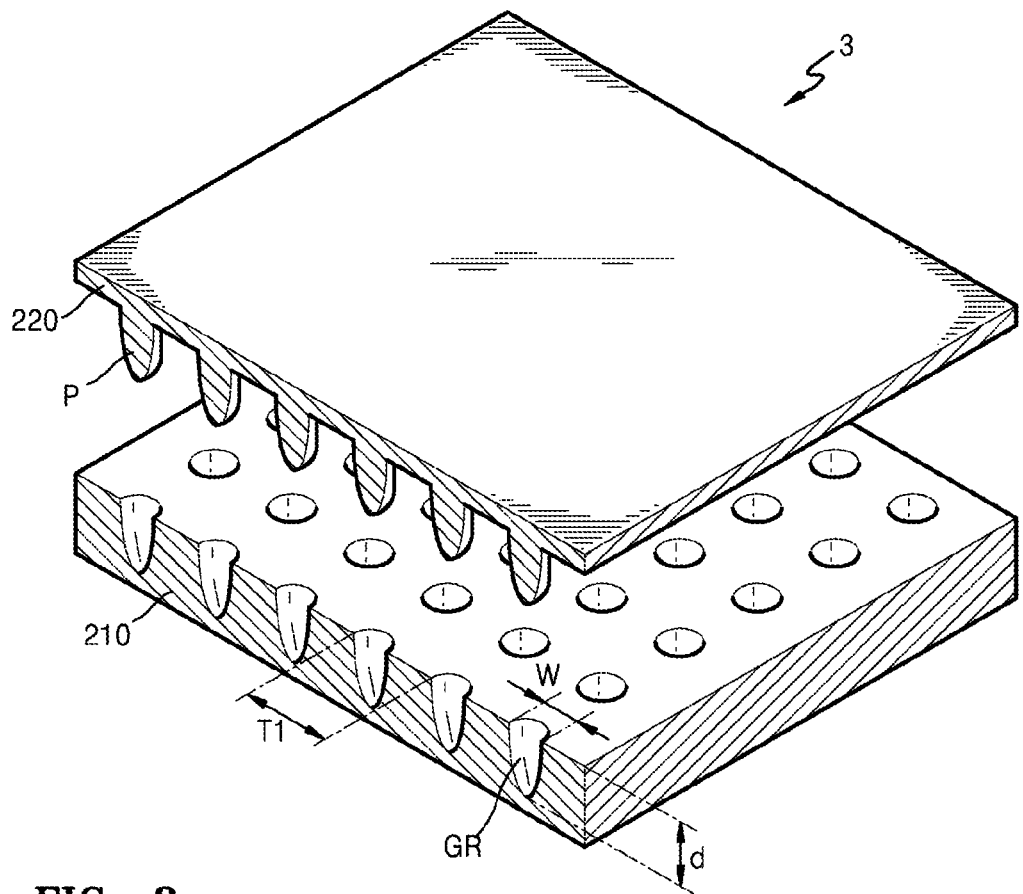

FIG. 7 is an exploded perspective view illustrating a schematic structure of an optical film according to still other example embodiments of the present disclosure.

Similarly to the optical film 1 of FIG. 1, the optical film 3 includes a lens pattern region and a non-pattern region. For convenience of description, the optical film 3 is shown to include only the lens pattern region.

The optical film 3 includes a high refractive index pattern layer 210 having a pattern in which the plurality of grooves GR each constituted by a curved surface are formed or engraved, and a low refractive index pattern layer 220 that is formed on the high refractive index pattern layer 210. The low refractive index pattern layer 220 is formed of a material having a refractive index that is lower than a refractive index of the high refractive index pattern layer 210, and includes filling portions P that fill the plurality of grooves GR.

The optical film 3 of the current example embodiments is different from the optical film 1 of FIG. 1 in that the groove GR has a dot (or, conical) shape.

Figure 8:
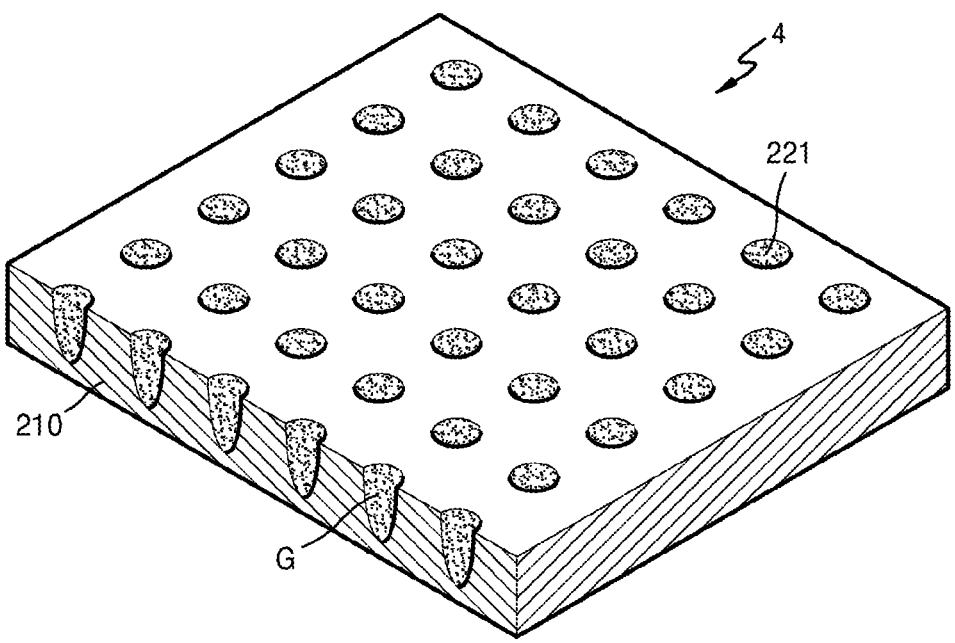

FIG. 8 is a perspective view illustrating a schematic structure of an optical film according to further example embodiments of the present disclosure.

Similarly to the optical film 1 of FIG. 1, the optical film 4 includes a lens pattern region and a non-pattern region. For convenience of description, the optical film 4 is shown to include only the lens pattern region.

The optical film 4 of the current example embodiments is different from the optical film 3 of FIG. 7 in terms of the shape of a low refractive index pattern layer 121. The low refractive index pattern layer 121 does not include a flat film connecting filling portions that fill the grooves GR, and is constituted by only the filling portions that fill the grooves GR. The filling portions that fill the grooves GR may be formed of a resin material or may be air or another gaseous medium.

The above-described optical films 1 through 4 may further include an adhesive layer, an anti-reflection film, a circular polarization film, a transmittance adjusting layer, or the like, which is necessary when the optical films 1 through 4 are applied to an organic light-emitting display device. Hereinafter, structures of optical films according to various example embodiments will be described in detail.

Figure 9:
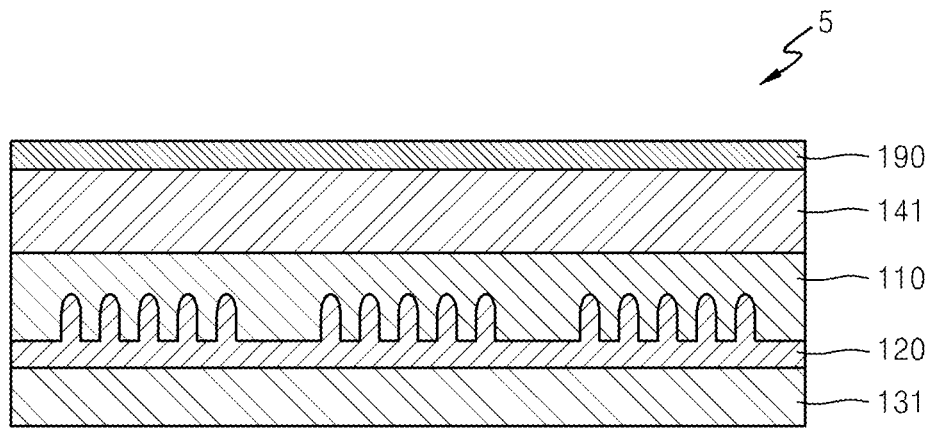

FIG. 9 is a cross-sectional view illustrating a schematic structure of an optical film according to yet other example embodiments of the present disclosure.

Referring to FIG. 9, an optical film 5 further includes an anti-reflection film 190 that is formed above the high refractive index pattern layer 110, and a first adhesive layer 131 that is formed under the low refractive index pattern layer 120. In addition, a first base layer 141 may further be formed between the high refractive index pattern layer 110 and the anti-reflection film 190.

The anti-reflection film 190 may have a multi-layered structure in which inorganic materials having different refractive indexes are stacked, for example, a two-layered structure including a high refractive index layer and a low refractive index layer.

The first adhesive layer 131, which is provided for adhesion with an organic light-emitting display panel, may be formed of a pressure sensitive adhesive (PSA) or may be formed of a PSA including a light absorber or a light diffuser. In addition, the high refractive index pattern layer 110 and/or the low refractive index pattern layer 120 may be formed of a transparent material containing a light absorber. When a material containing a light absorber is applied to various layers constituting an optical film, reflectivity of external light is decreased, thereby improving visibility.

The first base layer 141 is used as a base material for forming the high refractive index pattern layer 110 and the low refractive index pattern layer 120. The first base layer 141 may be formed of an optical isotropic material, for example, triacetyl cellulose (TAC).

FIGS. 10 to 16 are examples employing a circular polarization film and are cross-sectional views illustrating schematic structures of optical films according to various example embodiments of the present disclosure.

The circular polarization film may include a phase shift layer 150 and a linear polarization layer 160.

The linear polarization layer 160 may include a polyvinyl alcohol (PVA) film. Alternatively, the linear polarization layer 160 may have a structure in which the PVA film and a TAC film are stacked on each other, or may have various structures. The PVA film is a film that polarizes light, and may be formed by adsorbing a dichromatic pigment to PVA, which is a polymer material.

Figure 10:
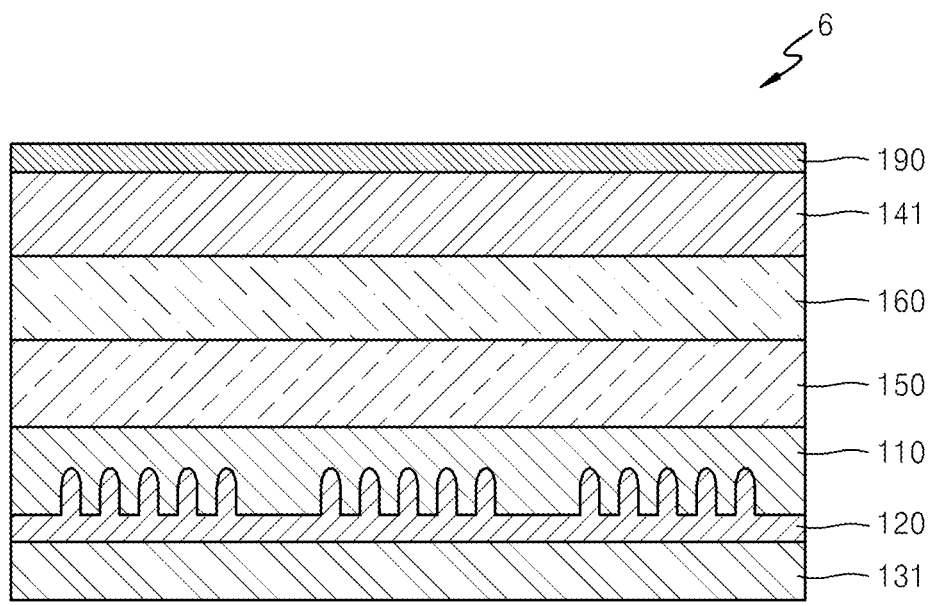
Figure 11:
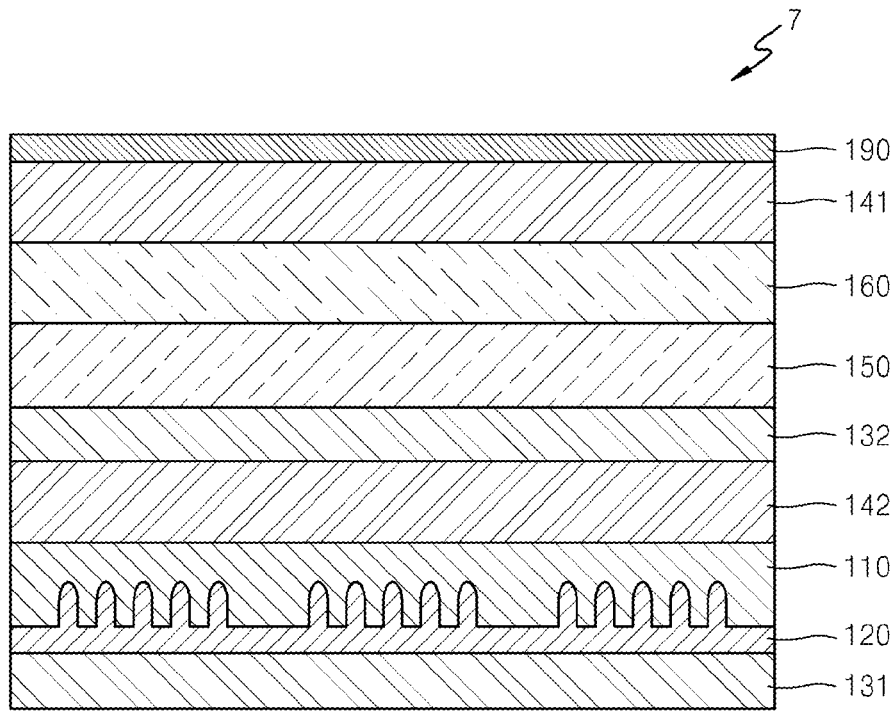

Referring to FIGS. 10 and 11, optical films 6 and 7 include the first adhesive layer 131, the low refractive index pattern layer 120, the high refractive index pattern layer 110, the phase shift layer 150, the linear polarization layer 160, the first base layer 141, and the anti-reflection film 190, which are sequentially disposed from the bottom.

The circular polarization film, including the phase shift layer 150 and the linear polarization layer 160, increases visibility of image formed by organic light-emitting display panel (not shown) by decreasing reflectivity of external light. When unpolarized external light is incident, the external light is changed to linearly polarized light while passing through the linear polarization layer 160, and is then changed to circularly polarized light by the phase shift layer 150. The circularly polarized light passes through the interface between the phase shift layer 150 and the high refractive index pattern layer 110, the high refractive index pattern layer 110, the low refractive index pattern layer 120, and the first adhesive layer 131, is reflected from the interface between the first adhesive layer 131 and the organic light-emitting display panel (not shown), and is then changed to circularly polarized light that rotates in an opposite direction. The circularly polarized light is changed to linearly polarized light that is perpendicular to a transmission axis of the linear polarization layer 160 while passing through the phase shift layer 150, and thus is not emitted to the outside.

As shown in FIGS. 10 and 11, the circular polarization film is disposed on the high refractive index pattern layer 110, and thus when the high refractive index pattern layer 110 is formed of an anisotropic material having a different optical axis from the circular polarization film, the polarization is broken. Thus, the incident external light may be emitted to the outside again, and the amount of reflectivity thereof may be rapidly increased, thereby decreasing visibility. Therefore, the high refractive index pattern layer 110 is required to be formed of an isotropic material having the same optical axis as the circular polarization film, for example, TAC or polycarbonate (PC) formed by solvent casting.

As compared with the optical film 6 of FIG. 10, the optical film 7 of FIG. 11 further includes a second base layer 142 and a second adhesive layer 132 between the high refractive index pattern layer 110 and the phase shift layer 150, which are disposed in this order toward the phase shift layer 150 from the high refractive index pattern layer 110.

Figure 12:
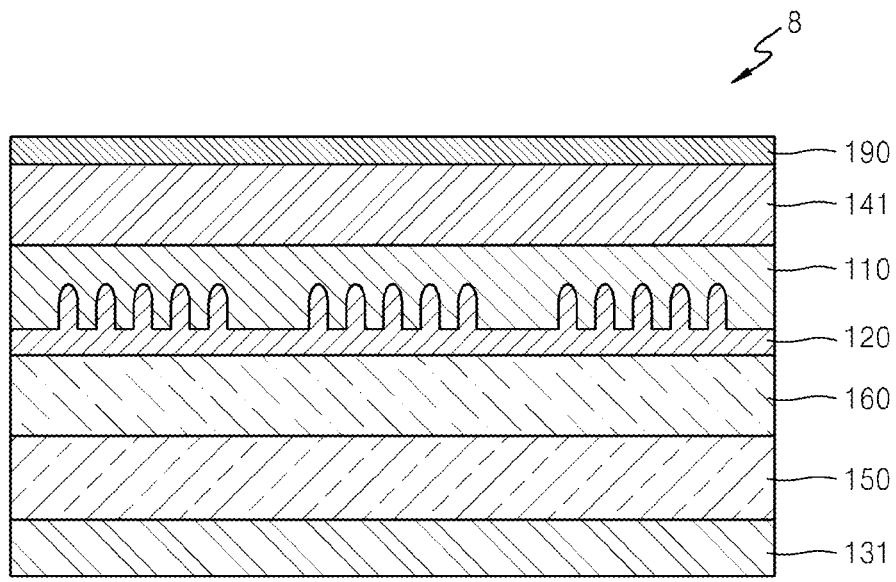
Figure 13:
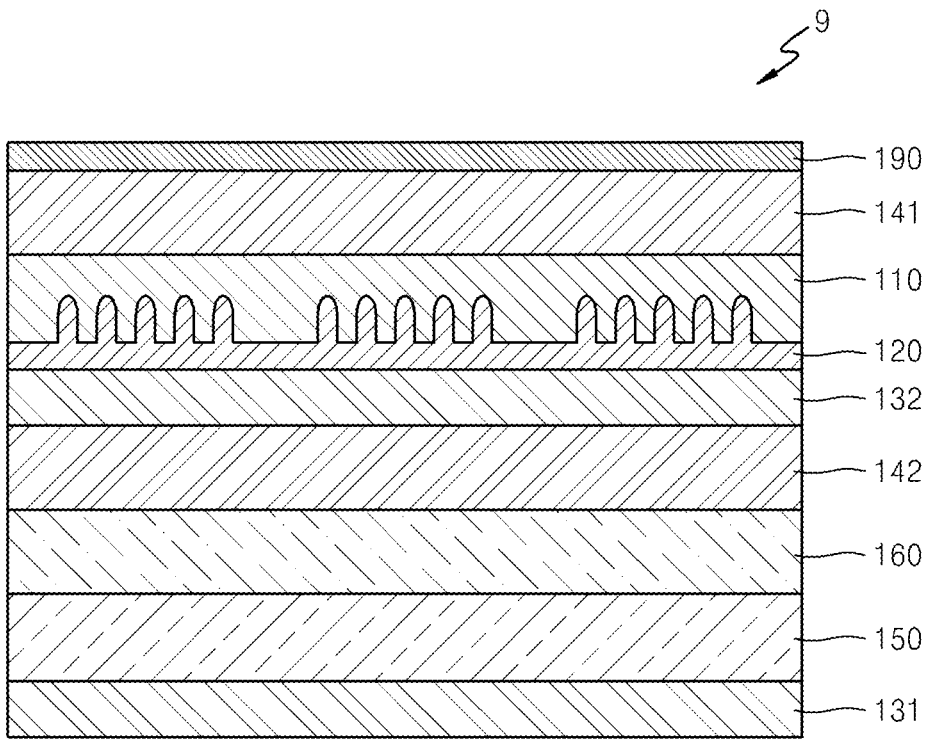

Referring to FIGS. 12 and 13, optical films 8 and 9 include the first adhesive layer 131, the phase shift layer 150, the linear polarization layer 160, the low refractive index pattern layer 120, the high refractive index pattern layer 110, the first base layer 141, and the anti-reflection film 190.

The optical film 9 of FIG. 13 further includes the second base layer 142 and the second adhesive layer 132 between the linear polarization layer 160 and the low refractive index pattern layer 120, which are disposed in this order toward the linear polarization layer 160 and the low refractive index pattern layer 120.

Figure 14:
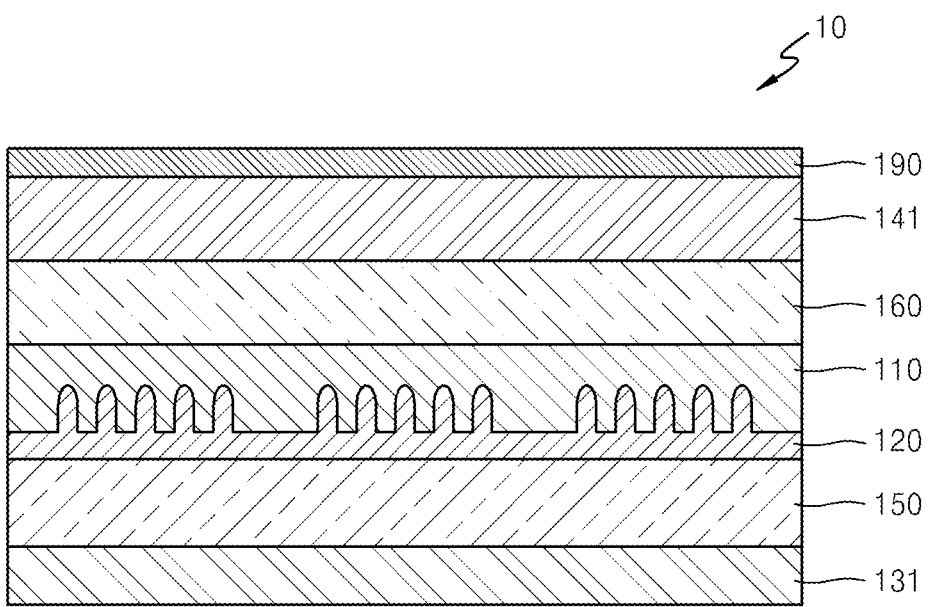
Figure 15:
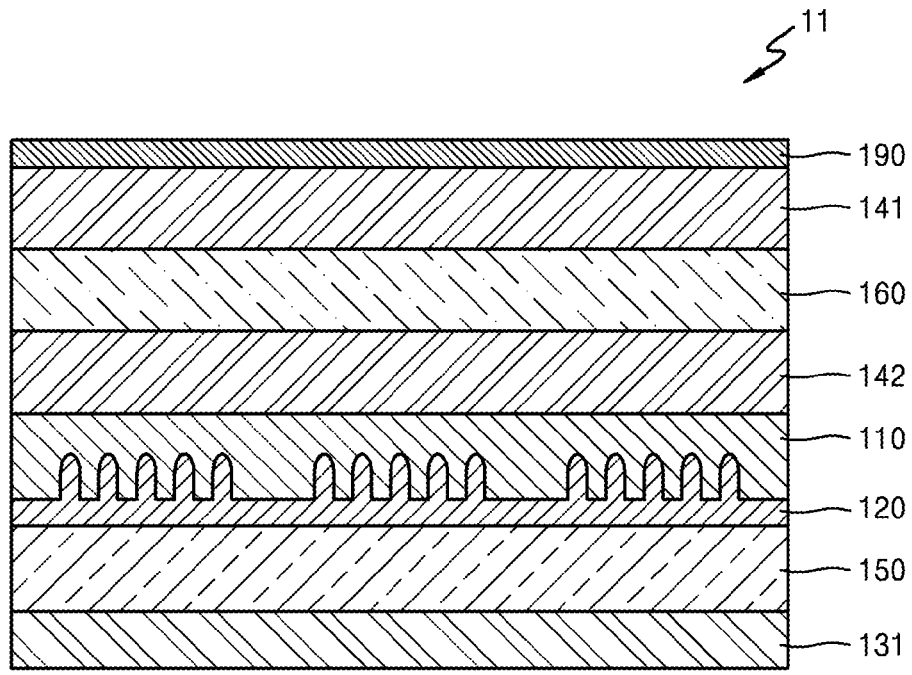

Referring to FIGS. 14 and 15, optical films 10 and 11 include the first adhesive layer 131, the phase shift layer 150, the low refractive index pattern layer 120, the high refractive index pattern layer 110, the linear polarization layer 160, the first base layer 141, and the anti-reflection film 190, which are sequentially disposed from the bottom.

The optical film 11 of FIG. 15 further includes the second base layer 142 between the high refractive index pattern layer 110 and the linear polarization layer 160.

Figure 16:
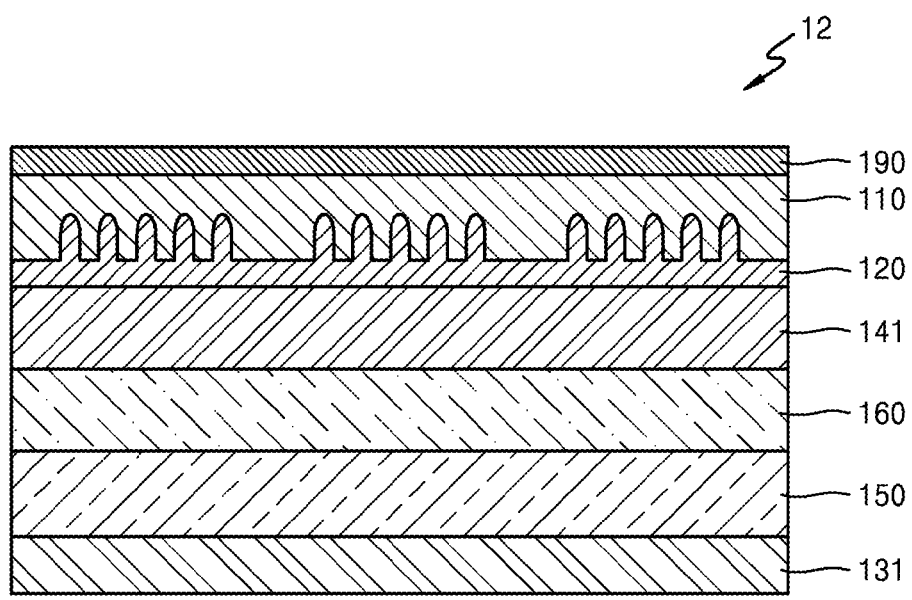

An optical film 12 of FIG. 16 includes the first adhesive layer 131, the phase shift layer 150, the linear polarization layer 160, the first base layer 141, the low refractive index pattern layer 120, the high refractive index pattern layer 110, and the anti-reflection film 190, which are sequentially disposed from the bottom.

FIGS. 17 through 20 are examples employing a transmittance adjusting layer and are cross-sectional views illustrating schematic structures of optical films according to various example embodiments of the present disclosure.

The transmittance adjusting layer 170 may be a film that is formed by diffusing a black dye, a pigment, carbon black, or cross-linked particles whose surfaces are coated with those materials, in a high molecular resin. The high molecular resin may be a binder, such as polymethyl methacrylate (PMMA) or a ultra-violet (UV)-curing resin, such as an acryl-based resin. However, the present disclosure is not limited thereto. In addition, the thickness of the transmittance adjusting layer 170 or the amount of a black material contained in the high molecular resin may be appropriately determined according to optical properties of the black material. The transmittance of the transmittance adjusting layer 170 may be equal to or greater than 40%, which is higher than the transmittance of the circular polarization film. The transmittance adjusting layer 170 is used to compensate for a disadvantage of the circular polarization film that almost perfectly blocks external light but has a low transmittance.

Figure 17:
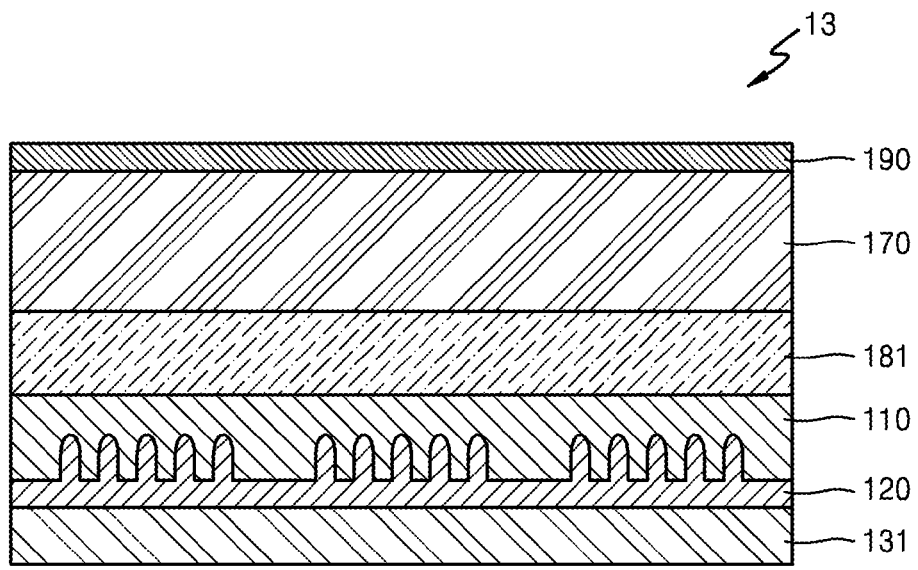
Figure 18:
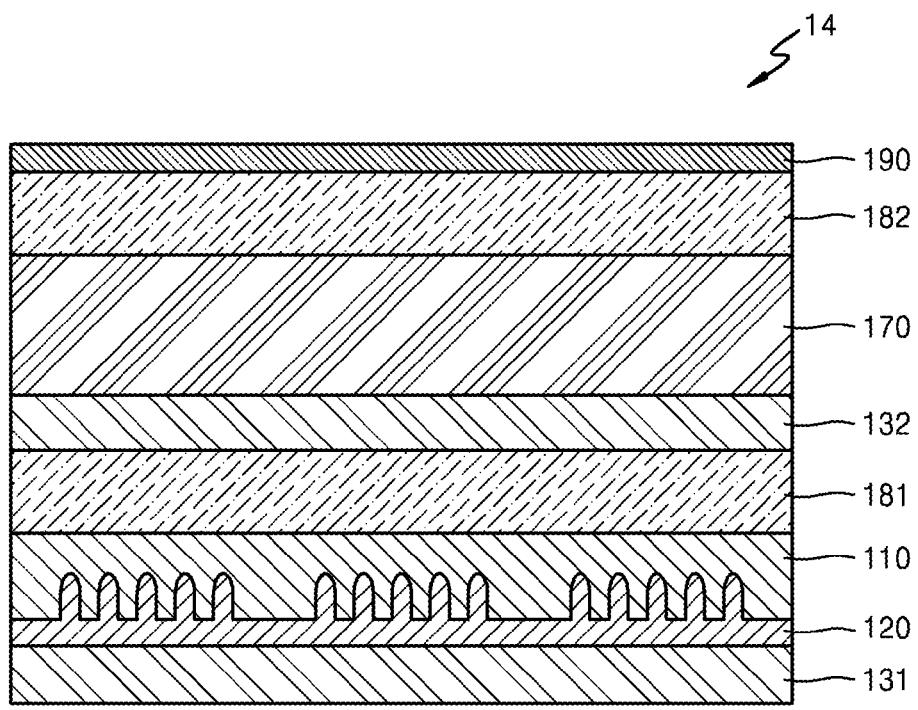

Referring to FIGS. 17 and 18, optical films 13 and 14 include the first adhesive layer 131, the low refractive index pattern layer 120, the high refractive index pattern layer 110, a first carrier film 181, the transmittance adjusting layer 170 and the anti-reflection film 190, which are sequentially disposed from the bottom.

The optical film 14 of FIG. 18 further includes the second adhesive layer 132 that is formed between the first carrier film 181 and the transmittance adjusting layer 170, and a second carrier film 182 that is formed between the transmittance adjusting layer 170 and the anti-reflection film 190.

Figure 19:
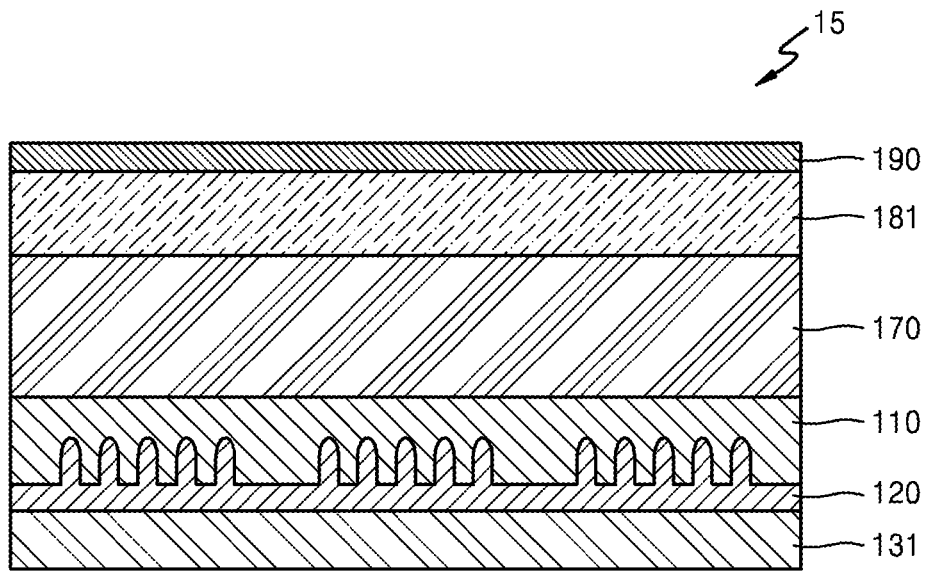
Figure 20:
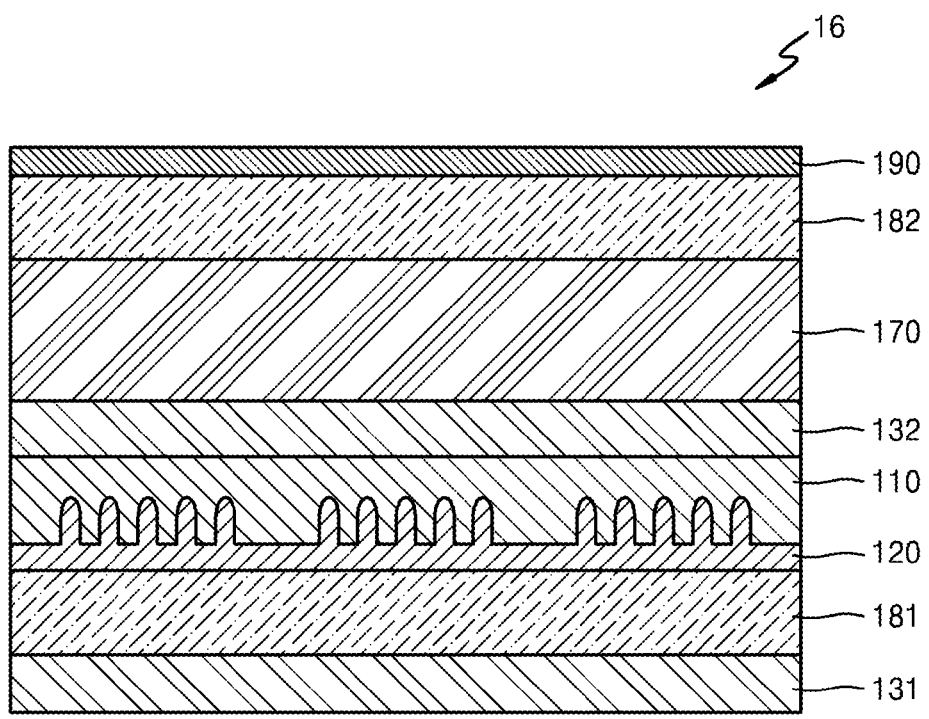

Optical films 15 and 16 of FIGS. 19 and 20 include the first adhesive layer 131, the low refractive index pattern layer 120, the high refractive index pattern layer 110, the transmittance adjusting layer 170, the first carrier film 181, and the anti-reflection film 190, which are sequentially disposed from the bottom.

The optical film 16 of FIG. 20 further includes the second adhesive layer 132 that is formed between the high refractive index pattern layer 110 and the transmittance adjusting layer 170, and the second carrier film 182 that is formed between the first adhesive layer 131 and the low refractive index pattern layer 120.

The first and second carrier films 181 and 182 are used as base materials for forming the high refractive index pattern layer 110 and the low refractive index pattern layer 120, or base materials for forming the anti-reflection film 190 or the transmittance adjusting layer 170. Because optical films 13 through 16 of FIGS. 17 through 20 do not include a linear polarization layer, the optical films 13 through 16 do not need a function of maintaining polarization. Thus, the optical films 13 through 16 may be formed of various materials including TAC, PET, PC, or the like as a base material.

In the optical films 5 through 16 of FIGS. 9 through 20, the high refractive index pattern layer 110 and the low refractive index pattern layer 120 have shapes shown in FIG. 2. However, the present disclosure is not limited thereto, and the high refractive index pattern layer 110 and the low refractive index pattern layer 120 may have shapes shown in FIGS. 6 through 8.

Figure 21:
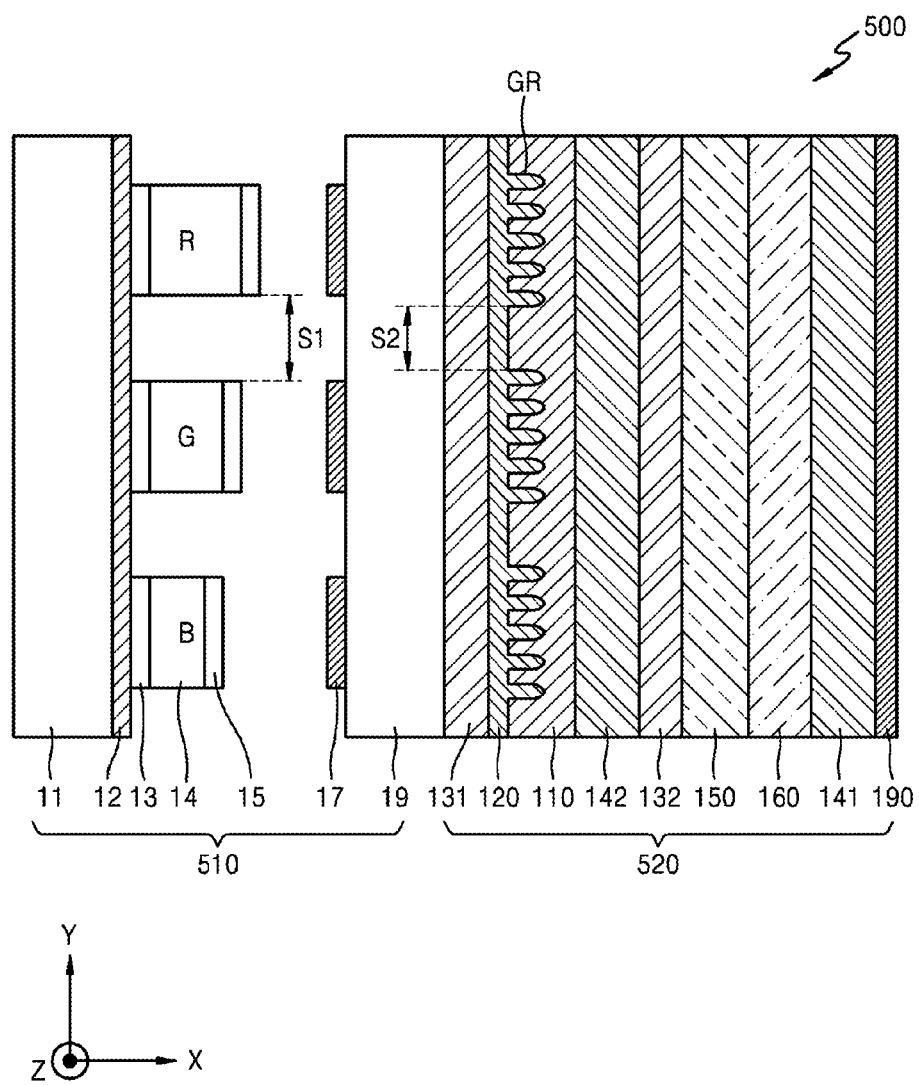
Figure 22:
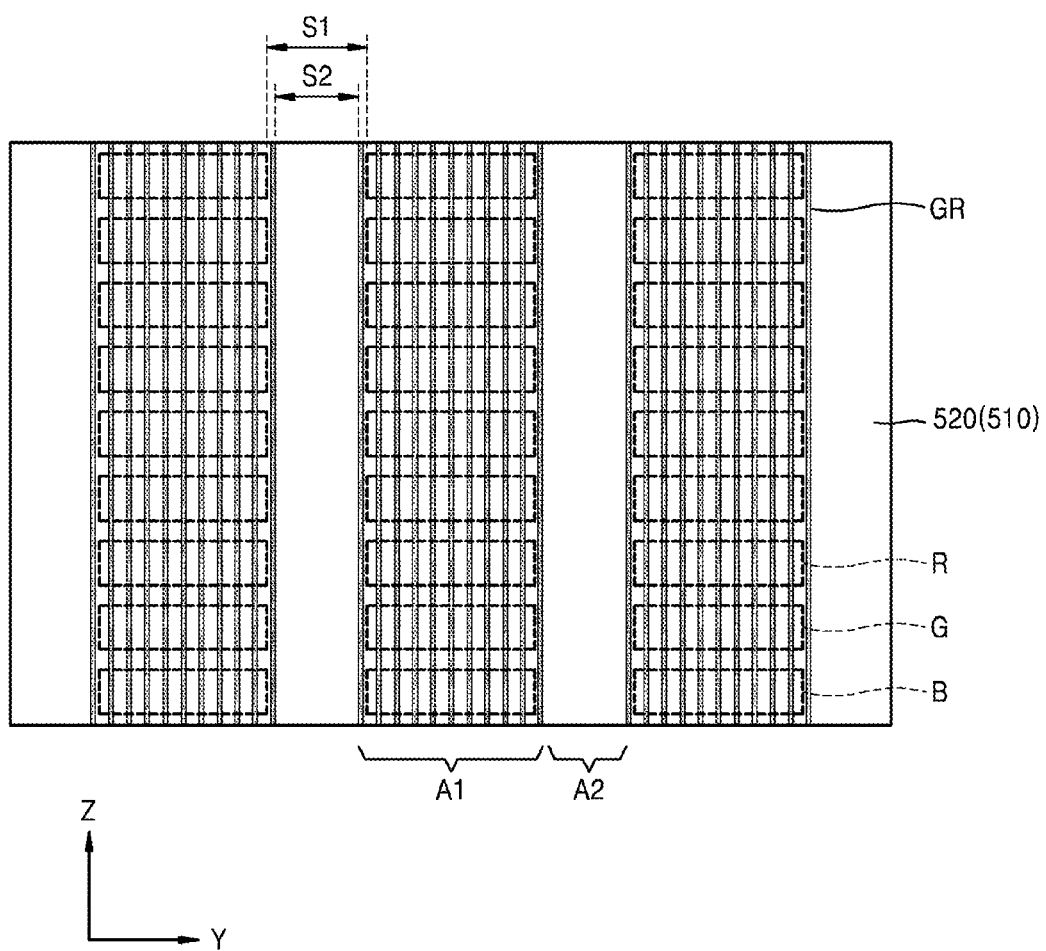

FIG. 21 is a cross-sectional view illustrating a schematic structure of an organic light-emitting display device according to example embodiments of the present disclosure, and FIG. 22 is a schematic diagram illustrating an arrangement relationship between an optical film and pixels of an organic light-emitting display panel in the organic light-emitting display device of FIG. 21.

The organic light-emitting display device 500 emits light beams having different wavelengths, and includes the organic light-emitting display panel 510 and the optical film 520. The organic light-emitting display panel 510 includes a plurality of pixels each including an organic light-emitting layer that has a microcavity structure configured to produce (or, causing) a resonance phenomenon with respect to the light beam of the corresponding wavelength. The optical film 520 is disposed on the organic light-emitting display panel 510.

The optical film 520 has a structure of the optical film 7 of FIG. 11. However, the present disclosure is not limited thereto, and the above-described various optical films may be used as the optical film 520.

The organic light-emitting display panel 510 is formed to have a microcavity structure in order to improve brightness and color purity. That is, the organic light-emitting display panel 510 includes a plurality of organic light-emitting diodes (OLEDs) each emitting any one of red, green, blue, and white colors. The OLED includes an anode 13, an organic light-emitting layer 14, and cathode 15. As shown in FIG. 7, the organic light-emitting display panel 510 includes the OLED configured in such a manner that the unit pixel thereof displays red (R), green (G), and blue (B). The organic light-emitting display panel 510 is formed to have a microcavity structure in which a distance between the anode 14 and the cathode 15 of the red OLED, which has a long wavelength, is the longest and a distance between the anode 14 and the cathode 15 of the blue OLED, which has a short wavelength, is the shortest. That is, the organic light-emitting display panel 510 is formed in such a manner that the distance between the anode 13 and the cathode 15 matches with a representative wavelength of red, green, and blue. Thus, only the corresponding light beam resonates and is emitted to the outside and other light beams are attenuated.

Hereinafter, the organic light-emitting display panel will be described in detail.

Each sub-pixel of the organic light-emitting display panel 510 is disposed between a first substrate 11 and a second substrate 19, which face each other. The sub-pixel may include the OLED including the anode 13, the organic light-emitting layer 14, and the cathode 15, and a driving circuit unit 12 that is formed on the first substrate 11 and is electrically connected to the anode 13 and the cathode 15.

Here, the anode 13 may be formed of an opaque metal, such as aluminum (Al), and the cathode 15 may be formed of a transparent electrode of oxide, such as indium tin oxide (ITO) or a semitransparent electrode of a nickel (Ni) thin film so that light emitted from the organic light-emitting layer 14 may easily pass therethrough.

The driving circuit unit 12 may include at least two thin film transistors (TFTs) (not shown) and capacitors (not shown). The driving circuit unit 12 controls the brightness of the OLED by controlling an amount of current to be applied to the OLED in response to a data signal.

The driving circuit unit 12 is a circuit for driving the unit pixel of the organic light-emitting display panel 510. The driving circuit unit 12 may include a gate line, a data line that perpendicularly crosses the gate line, a switching TFT that is connected to the gate line and the data line, a driving TFT that is connected to the OLED between the switching TFT and a power line, and a storage capacitor that is connected between a gate electrode of the driving TFT and the power line.

Here, the switching TFT applies the data signal of the data line to the gate electrode of the driving TFT and the storage capacitor, in response to a scan signal of the gate line. The driving TFT controls the brightness of the OLED by adjusting a current applied from the power line to the OLED in response to the data signal from the switching TFT. In addition, the storage capacitor is charged with the data signal from the switching TFT and applies a charged voltage to the driving TFT, so that the driving TFT may apply a constant current even though the switching TFT is turned off.

The organic light-emitting layer 14 includes a hole injection layer (HIL), a hole transport layer (HTL), an emission layer, an electron transport layer (ETL), and an electron injection layer (EIL) that are sequentially stacked on the anode 13. According to such a structure, when a forward voltage is applied between the anode 13 and the cathode 15, electrons move to the emission layer via the EIL and the ETL from the cathode 15, and holes move to the emission layer via the HIL and the HTL from the anode 13. The electrons and the holes, which are injected into the emission layer, are recombined in the emission layer to thereby generate excitons. The excitons emit light while transitioning from an excited state to a ground state. At this time, the brightness of the emitted light is proportional to the amount of current flowing between the anode 13 and the cathode 15.

In addition, the organic light-emitting display panel 510 includes color filters 17 in order to improve color efficiency. Here, the color filters 17 are formed on the second substrate 19, wherein a red color filter is formed in a red sub-pixel area, a green color filter is formed in a green sub-pixel area, and a blue color filter is formed in a blue sub-pixel area. If when the unit pixel is constituted by four colors (red, green, blue, and white), the color filter 17 may not be formed in a white sub-pixel area.

Although not shown in the drawing, a black matrix for reducing (or, preventing) light leakage and mixing of colors may be formed at an interface between sub-pixels in the second substrate 19. In addition, a spacer for electrically connecting the anode 13 and the cathode 15, and a spacer for electrically connecting the anode 13 and the driving circuit unit 12 may be formed, and such an electrical connection may be made by bonding between the first substrate 11 and the second substrate 19 using a sealing material.

On the other hand, in the organic light-emitting display device 500 employing a microcavity structure, as a viewing angle is tilted toward the side from the front, maximum resolution wavelength becomes shorter, and thus color shift occurs as the maximum resolution wavelength decreases. For example, even if white color is embodied at the front, the white color may become bluish at a lateral side due to blue shift phenomenon.

In the organic light-emitting display device 500 of the current example embodiments, the optical film 520 is disposed on the organic light-emitting display panel 510 in order to reduce the color shift.

The groove GR of the optical film 520 may have an extended stripe shape. In this case, the optical film 520 is disposed on the organic light-emitting display panel 510 in such a manner that a longitudinal direction of the stripe shape is a vertical (Z) direction of the organic light-emitting display panel 510. In addition, the optical film 520 may be disposed on the organic light-emitting display panel 510 so that n grooves GR (where n is an integer) of the optical film 520 correspond to one pixel of the organic light-emitting display panel 510. However, the number of grooves GR shown in the drawing is just an example, and is not limited thereto.

In addition, the optical film 520 includes the lens pattern region A1 in which the plurality of grooves GR are formed, and the non-pattern region A2. A width S2 of the non-pattern region A2 in a horizontal direction Y is formed to be smaller than a width S1 between the adjacent pixels that are separated from each other in the horizontal direction Y. In addition, a ratio of an area of the lens pattern region A1 in the optical film 520 may be greater than an aperture ratio of the organic light-emitting display panel.

As described above with reference to FIGS. 3 and 4, the high refractive index pattern layer 110 and the low refractive index pattern layer 120 which correspond to the lens pattern region A1, emit light, which is incident at a constant angle, at various angles to thereby serve as a color shift reducing layer. The light emitted from the organic light-emitting display panel 510 has distribution of a set (or, predetermined) angle, and has color shift properties that are slightly different from each other according to the angle. After the light passes through the color shift reducing layer including the high refractive index pattern layer 110 and the low refractive index pattern layer 120, a light beam incident on the color shift reducing layer at an angle with a small color shift and a light beam incident on the color shift reducing layer at an angle with a large color shift are evenly mixed and are then emitted, and thus the color shift is reduced according to a viewing angle of a viewer.

In addition, the non-pattern region A2 reduces image blur that may occur due to the optical film 1.

When the width S2 of the non-pattern region A2 is set to be excessively large, the degree of a reduction in color shift, which is an intended function of the optical film 520, may deteriorate. In addition, when the width S2 of the non-pattern region A2 is set to be excessively small, image blur may occur as described above with reference to FIG. 5. Thus, the width S1 and the width S2 are required to be appropriately determined.

Figure 23:
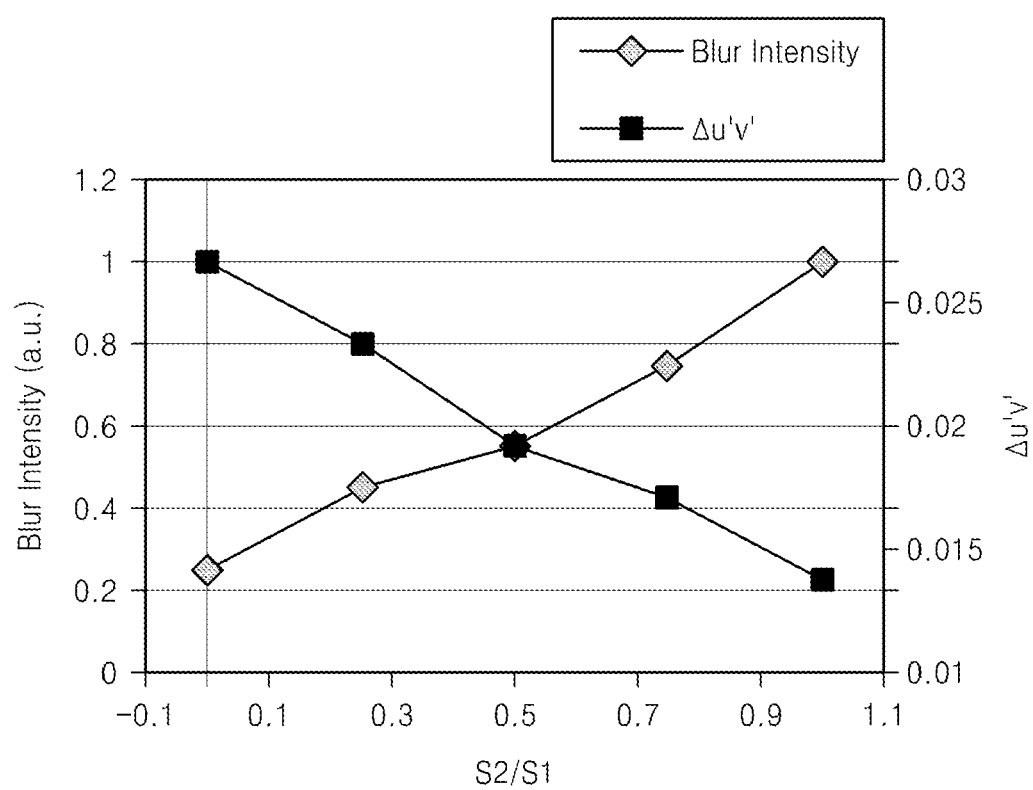

FIG. 23 is a simulation graph illustrating image blur (blur intensity) and color shift of the degree of a reduction.

The degree of blur is represented by a relative ratio of luminance intensity of blur occurring at an intermediate point between pixels. As the relative ratio increases, the image blur increases.

The color shift uv represents the degree of color shift at a viewing angle of 60 degrees, on the basis of a front white (x, y)=(0.28, 0.29) color. As the value of the color shift at a viewing angle of 60 degrees is reduced, the color shift according to the viewing angle is excellent. In general, when the color shift is less than approximately 0.02, the color shift is not likely to be recognized by human eyes.

Referring to the graph, as the S2/S1 decreases, the image blur is reduced, but the degree of improvement of the color shift is decreased. On the contrary, as the S2/S1 increases, there is an advantage in terms of the improvement of the color shift, but the excessive degree of the image blur occurs. Such a tendency is maintained according to a light-emitting property, but an absolute value may vary. An appropriate range of the S2/S1 may be set in consideration of the degree of improvement of the color shift and the degree of the image blur.

In FIG. 22, R, G, and B pixels are shown to have the same size. However, this is just an example, and the sizes thereof may be adjusted according to the brightness of the pixels. In addition, the shapes of the pixels may vary.

In addition, it is shown that a longitudinal direction of the groove GR is consistent with a vertical direction Z of the organic light-emitting display panel 510. However, the longitudinal direction of the groove GR may be inclined at a set (or, predetermined) angle with respect to the vertical direction Z of the organic light-emitting display panel 510 in order to reduce the likelihood of (or, prevent) a moire pattern from being generated.

The above-mentioned optical film refracts light that is incident obliquely and light that is incident perpendicularly, in various directions including a direction toward a front and a direction toward a side, and emits the light.

Therefore, in an organic light-emitting display device employing the above-described optical film, an organic light-emitting layer may be formed to have a microcavity structure in which color purity is improved. At this time, color shift according to a viewing angle may be reduced, and thus a high-quality image may be provided.

In addition, in the above-mentioned optical film, when the optical film including a lens pattern region and a non-pattern region which are alternately formed is attached onto a display panel, the non-pattern region is formed to correspond to at least a part of a non-emission region of the display panel, thereby allowing image blur to be reduced (or, minimized).

It should be understood that the example embodiments described herein should be considered in a descriptive sense only and not for purposes of limitation. Descriptions of features within each embodiment should typically be considered as available for other similar features in other example embodiments.

What is claimed is:

1. An optical film, comprising:
    a high refractive index pattern layer including a lens pattern region and a non-pattern region alternately formed, wherein the lens pattern region includes a plurality of grooves and flat surfaces between each of the plurality of grooves, and the non-pattern region has no pattern; and
    a low refractive index pattern layer formed of a material having a refractive index smaller than a refractive index of the high refractive index pattern layer, wherein the low refractive index pattern includes a plurality of filling portions filling the plurality of grooves,
    wherein light is incident to the optical film through the low refractive index pattern layer and is emitted through the second surface of the high refractive pattern layer.

2. The optical film of claim 1, wherein the lens pattern region has a width larger than a width of the non-pattern region.

3. The optical film of claim 1, wherein
    the low refractive index pattern layer further includes a flat film having a set thickness, and
    the flat film connects the plurality of filling portions.

4. The optical film of claim 1, wherein the low refractive index pattern layer is formed of a resin material.

5. The optical film of claim 1, wherein the plurality of grooves each have an extended stripe shape.

6. The optical film of claim 1, wherein the plurality of grooves each have a dot shape in a perspective view with respect to the high refractive index pattern layer, and a parabolic shape in a cross-sectional view with respect to the high refractive index pattern layer.

7. The optical film of claim 1,
wherein the optical film is on a display panel having an arrangement of pixels, the arrangement of pixels including an emission region and a non-emission, region alternately formed,
wherein the lens pattern region faces the emission region; and
wherein the lens pattern region and the non-pattern region are arranged so that the non-pattern region faces at least a part of the non-emission region.

8. The optical film of claim 7, wherein the lens pattern region has a width larger than a width of the emission region.

9. The optical film of claim 1, further comprising:
an anti-reflection film on the high refractive index pattern layer; and
a first adhesive layer under the low refractive index pattern layer.

10. The optical film of claim 9, further comprising:
a first base layer between the high refractive index pattern layer and the anti-reflection film.

11. The optical film of claim 10, further comprising:
a circular polarization film between the high refractive index pattern layer and the anti-reflection film, the circular polarization film including a phase shift layer and a linear polarization layer.

12. The optical film of claim 11, wherein the first adhesive layer, the low refractive index pattern layer, the high refractive index pattern layer, the phase shift layer, the linear polarization layer, the first base layer and the anti-reflection film are sequentially arranged.

13. The optical film of claim 9, further comprising:
a phase shift layer, a linear polarization layer, and a first base layer,
wherein the first adhesive layer, the phase shift layer, the linear polarization layer, the first base layer and the low refractive index pattern layer are sequentially arranged.

14. The optical film of claim 9, further comprising:
a transmittance adjusting layer between the high refractive index pattern layer and the anti-reflection film.

15. An organic light-emitting display device, comprising:
an organic light-emitting display panel including a plurality of pixels and an organic light-emitting layer, wherein the plurality of pixels each emit light beams having different wavelengths, and the organic light-emitting layer has a microcavity structure configured resonate and emit a light beam of a corresponding wavelength; and
the optical film according to claim 2 on the organic light-emitting display panel.

16. The organic light-emitting display device of claim 15, wherein the plurality of grooves each have an extended stripe shape.

17. The organic light-emitting display device of claim 16, wherein the optical film is arranged on the organic light-emitting display panel in such a manner that a longitudinal direction of the extended stripe shape is in a vertical direction of the organic light-emitting display panel.

18. The organic light-emitting display device of claim 17, wherein a width of the non-pattern region of the optical film in a horizontal direction is smaller than a distance between the plurality of pixels separated from each other in the horizontal direction.

19. The organic light-emitting display device of claim 15, wherein a ratio of an area of the lens pattern region in the optical film is greater than an aperture ratio of the organic light-emitting display panel.

20. The organic light-emitting display device of claim 15, further comprising:
a first adhesive layer between the organic light-emitting display panel and the low refractive index pattern layer; and
an anti-reflection film on the high refractive index pattern layer.

21. The organic light-emitting display device of claim 20, further comprising:
a circular polarization film or a transmittance adjusting layer between the high refractive index pattern layer and the anti-reflection film, the circular polarization film including a phase shift layer and a linear polarization layer.

* * * * *